(12) United States Patent
Seidler

(10) Patent No.: US 11,171,475 B2
(45) Date of Patent: Nov. 9, 2021

(54) FAULT CURRENT SENSOR FOR A FAULT CURRENT PROTECTION DEVICE FOR MONITORING AN ELECTRICAL CONSUMER FOR A VEHICLE

(71) Applicant: JENOPTIK Advanced Systems GmbH, Wedel (DE)

(72) Inventor: Klaus Seidler, Uetersen (DE)

(73) Assignee: Jenoptik Advanced Systems GmbH, Wedel (DE)

( * ) Notice: Subject to any disclaimer, the term of this patent is extended or adjusted under 35 U.S.C. 154(b) by 314 days.

(21) Appl. No.: 15/742,830

(22) PCT Filed: Jul. 7, 2016

(86) PCT No.: PCT/EP2016/066145
§ 371 (c)(1),
(2) Date: Jan. 8, 2018

(87) PCT Pub. No.: WO2017/005858
PCT Pub. Date: Jan. 12, 2017

(65) Prior Publication Data
US 2018/0205214 A1    Jul. 19, 2018

(30) Foreign Application Priority Data

Jul. 8, 2015   (DE) ..................... 10 2015 008 699.5

(51) Int. Cl.
*H02H 3/16*   (2006.01)
*H02H 3/33*   (2006.01)
*G01R 19/10*   (2006.01)
*G01R 19/145*   (2006.01)
(Continued)

(52) U.S. Cl.
CPC ............... *H02H 3/16* (2013.01); *G01R 19/10* (2013.01); *G01R 19/145* (2013.01);
(Continued)

(58) Field of Classification Search
CPC ............ H02H 3/33; H02H 3/334; H02H 3/16; H02H 3/162; H02H 3/17; H02H 3/167; H02H 3/32–334; G01R 19/00–32
See application file for complete search history.

(56) References Cited

U.S. PATENT DOCUMENTS 4,947,278 A * 8/1990 Nichols, III ......... H01H 47/002
30/45
6,421,214 B1 * 7/2002 Packard ................. H02H 3/335
361/7
(Continued)

FOREIGN PATENT DOCUMENTS

DE    102010028626 A1   11/2011
EP        2020014 A1    2/2009

*Primary Examiner* — Jared Fureman
*Assistant Examiner* — Christopher J Clark
(74) *Attorney, Agent, or Firm* — Muncy, Geissler, Olds & Lowe, P.C.

(57) ABSTRACT

A fault current sensor for a fault current protection device for monitoring an electrical consumer for a vehicle is provided. The fault current sensor has a measuring device for measuring a differential current between a first electrical current in an electrical forward conductor, which conducts from a control device for controlling the electrical consumer to the electrical consumer, and a second electrical current in an electrical return conductor, which conducts away from the electrical consumer. The fault current sensor also has a reporting device for reporting a fault current at the control device via the forward conductor depending on a comparison of the measured differential current with a threshold value.

17 Claims, 5 Drawing Sheets

(51) Int. Cl.
*G01R 19/165* (2006.01)
*H02H 1/00* (2006.01)
*H02H 3/08* (2006.01)
(52) U.S. Cl.
CPC ..... *G01R 19/165* (2013.01); *G01R 19/16528* (2013.01); *H02H 1/0007* (2013.01); *H02H 3/33* (2013.01); *H02H 3/334* (2013.01); *H02H 1/0076* (2013.01); *H02H 3/08* (2013.01)

(56) References Cited

U.S. PATENT DOCUMENTS

| | | | |
|---|---|---|---|
| 2006/0119368 A1* | 6/2006 | Sela | H02J 7/0042 |
| | | | 324/522 |
| 2006/0158798 A1* | 7/2006 | Jackson | H02H 3/334 |
| | | | 361/42 |
| 2007/0247773 A1 | 10/2007 | Bartonek et al. | |
| 2010/0026087 A1* | 2/2010 | Morita | H04B 3/54 |
| | | | 307/3 |
| 2011/0273139 A1* | 11/2011 | Hofheinz | B60L 3/0023 |
| | | | 320/109 |
| 2012/0170159 A1* | 7/2012 | Huang | G01R 31/025 |
| | | | 361/42 |
| 2013/0211606 A1* | 8/2013 | Takemura | H04B 3/54 |
| | | | 700/286 |
| 2014/0009299 A1* | 1/2014 | Fahrenkrug | G01R 31/025 |
| | | | 340/664 |
| 2014/0111094 A1* | 4/2014 | Kodama | H05B 33/08 |
| | | | 315/129 |
| 2017/0025892 A1* | 1/2017 | Van Ostrand | G01R 19/2513 |
| 2017/0187172 A1* | 6/2017 | Kim | H01H 9/54 |
| 2018/0299499 A1* | 10/2018 | Seidler | H02H 1/0076 |

* cited by examiner

FAULT CURRENT SENSOR FOR A FAULT CURRENT PROTECTION DEVICE FOR MONITORING AN ELECTRICAL CONSUMER FOR A VEHICLE

This nonprovisional application is a National Stage of International Application No. PCT/EP2016/066145, which was filed on Jul. 7, 2016, and which claims priority to German Patent Application No. DE 10 2015 008 699.5, which was filed in Germany on Jul. 8, 2015, and which are both herein incorporated by reference.

BACKGROUND OF THE INVENTION

Field of the Invention

The present invention relates to a residual current sensor for a residual current protective device for monitoring an electrical load for a vehicle, to a residual current protective device for monitoring an electrical load for a vehicle, to a method for determining a residual current of an electrical load for a vehicle and to a corresponding computer program product.

Description of the Background Art

Residual current circuit breakers, which, depending on the configuration, when a residual current value is reached, can disconnect a connected load in a multi-pole manner and thus completely isolate said load from a supply, can be used in industrial technology and domestic technology. Components of this kind can be switched back on manually or else by remote control. In applications of this kind, components that are to be monitored can usually be connected entirely by means of electrical lines.

EP 2 020 014 A1 relates to a switching device, such as a residual current circuit breaker or combination switch, for example, for interrupting and switching at least one line.

SUMMARY OF THE INVENTION

Against this background, the present invention is used to present a residual current sensor for a residual current protective device for monitoring an electrical load for a vehicle, a residual current protective device for monitoring an electrical load for a vehicle, a method for determining a residual current of an electrical load for a vehicle and a corresponding computer program product, as claimed in the main claims. Advantageous refinements emerge from the respective subclaims and the following description.

In accordance with embodiments of the present invention, a remote residual current sensor for a controller of an electrical load can be provided, wherein current return lines via grounded structures can be used, for example. In other words, a remote residual current sensor can be provided, for example, for a heater controller for use in aircraft and thus a heater controller having a remote residual current sensor for use in aircraft can be realized. It is therefore possible to realize a circuit-based solution for monitoring an electrical load for the occurrence of a residual current by observing or taking into account current feedback via a grounded structure or via busbars. In this case, it is also possible to realize an installation position of a protective component of this kind that is difficult to access.

In accordance with embodiments of the present invention, cost-effective and reliable residual current protection can advantageously be provided for electrical loads in vehicles, in particular in vehicles having installation locations for electrical loads and protective devices that are difficult to access. Specifically in terms of an application in aircraft or in aviation, electrical loads, in particular heated components, can be monitored for an arising residual current. This can be effected in heated components by extending a heater controller function. Functions or capabilities of an already present control apparatus, in particular an already present heater controller, can be used here, wherein an output current evaluation logic system can be provided, for example also in the form of software. The proposed residual current sensor can represent a simple, robust and cost-effective circuit, which can be installed upstream of a component to be protected, in particular a heated component, without additional wiring.

It is therefore possible to achieve residual current protection while avoiding additional wiring outlay or wiring modification, which, in particular, can also make a weight saving that is advantageous with respect to economic considerations possible in aircraft, for example in comparison to an additional residual current circuit breaker. In terms of an application in aviation, embodiments of the present invention can also be used as cost-effective, reliable and space-saving as well as weight-saving alternatives to manually resettable residual current circuit breakers or else to remote-controlled residual current circuit breakers that can be switched back on. This is advantageous, since manually resettable residual current circuit breakers are generally impractical considering conventional electrical connection technology, since they have to be installed directly on a component that is to be monitored and are thus barely accessible. Remote-controlled residual current circuit breakers that can be switched back on are complex components that may also require additional connections and devices for remote-controlled resetting. In comparison thereto, using the described approach can increase operational safety of electrical loads that are to be monitored with a reduced level of outlay.

A residual current sensor for a residual current protective device for monitoring an electrical load for a vehicle is presented, wherein the residual current sensor has the following features:

a measuring apparatus for measuring a differential current between a first electric current in an electrical forward conductor, which forward-conducts from a control apparatus for controlling the electrical load to the electrical load, and a second electric current in an electrical reverse conductor, which conducts away from the electrical load; and a signaling apparatus for signaling a residual current to the control apparatus via the forward conductor depending on a comparison of the measured differential current with a threshold value.

The residual current sensor and the control apparatus can be parts of the residual current protective device. The residual current protective device can be referred to as what is known as an FI switch or a residual current circuit breaker. The residual current sensor, as well as the residual current protective device, can be used here, in particular, in a motor vehicle, for example in an aircraft. The electrical load can be embodied, for example, as a heater or another load. The residual current sensor can be electrically connected between the control apparatus and the electrical load. The residual current protective device can also be configured or provided, for example, for monitoring a plurality of electrical loads.

In accordance with one embodiment, the signaling apparatus can be configured to signal the residual current to the control apparatus using current amplitude modulation on the forward conductor. An embodiment of this kind offers the advantage that a present residual current can be reported in a simple, reliable and uncomplicated manner.

Furthermore, the signaling apparatus can have a switch for load changeover and a defined load. In this case, the defined load can be electrically conductively connected to the reverse conductor. The switch can be configured here, in an open switching position, to interrupt the forward conductor to the electrical load and to connect the forward conductor to the defined load. A current through the defined load can be below a range that represents a supply current range of the electrical load and said current can be interpreted by the control apparatus as an occurrence of an identified residual current. An embodiment of this kind offers the advantage that the occurrence of a residual current can be signaled in a reliable and uncomplicated manner.

The signaling apparatus can also have a switch for connecting a defined load. In this case, the defined load can be electrically conductively connected to the reverse conductor. The switch can be configured, in a closed switching position, to connect the defined load to the forward conductor. The load can therefore remain switched on. A resulting summation current from a load current and a current of the defined load can be above a range that represents a supply current range of the electrical load and said current can be interpreted by the control apparatus as an occurrence of an identified residual current. An embodiment of this kind offers the advantage that the occurrence of a residual current can be signaled in a reliable and uncomplicated manner.

In addition, the signaling apparatus can have a switch for load disconnection. The switch can be configured here, in an open switching position, to interrupt the forward conductor to the electrical load. An embodiment of this kind offers the advantage that a detected residual current can be communicated in a quick and reliable manner.

The signaling apparatus can also be configured to signal the residual current to the control apparatus by modulation of a high-frequency data signal on the forward conductor. An embodiment of this kind offers the advantage that the presence of a residual current can be signaled in a reliable and cost-effective manner using carrier frequency technology.

In accordance with one embodiment, the residual current sensor can have an electrical circuit for carrying out the comparison of the measured differential current with a threshold value. The electrical circuit can be configured to carry out the comparison of the measured differential current with a threshold value. The electrical circuit can optionally also be configured to execute further functions for the residual current sensor. An embodiment of this kind offers the advantage that it is possible to identify whether the occurrence of a residual current is present in a quick and reliable manner.

A residual current protective device for monitoring an electrical load for a vehicle is also presented, wherein the residual current protective device has the following features:

an embodiment of the aforementioned residual current sensor; and a control apparatus for controlling the electrical load, wherein the control apparatus and the residual current sensor can be or are electrically conductively connected to one another at least by means of the forward conductor.

One embodiment of the aforementioned residual current sensor can advantageously be used in connection with the residual current protective device to identify or to detect a residual current with respect to the electrical load. The control apparatus can be configured to interrupt a flow of electric current through the electrical load depending on a signaled residual current.

In accordance with one embodiment, the control apparatus and the residual current sensor can be housed separately from one another. In this case, the residual current sensor can be arranged outside of a housing of the control apparatus. In other words, a housing of the control apparatus and a housing of the residual current sensor can be arranged separately from one another. An embodiment of this kind offers the advantage that, in particular, a residual current with respect to the electrical load can also be reliably identified in the case of current feedback from the electrical load in a partial section via a grounded component.

The residual current sensor can also have a forward conductor input connection for connection to a control-apparatus-side section of the forward conductor, a forward conductor output connection for connection to a load-side section of the forward conductor, a reverse conductor input connection for connection to a load-side section of the reverse conductor and a reverse conductor output connection for connection to a structure-side section of the reverse conductor. The control-apparatus-side section of the forward conductor represents a subsection of the forward conductor, by means of which the residual current sensor and the control apparatus can be or are electrically conductively connected to one another. The load-side section of the forward conductor represents a subsection of the forward conductor, by means of which the residual current sensor and the electrical load can be or are electrically conductively connected to one another. The load-side section of the reverse conductor represents a subsection of the reverse conductor, by means of which the residual current sensor and the electrical load can be or are electrically conductively connected to one another. The structure-side section of the reverse conductor represents a subsection of the reverse conductor, by means of which the residual current sensor can be or is connected to the control apparatus by means of a structure element of the vehicle. An embodiment of this kind offers the advantage that the residual current sensor can be arranged remotely from the control apparatus in a simple and uncomplicated manner.

In this case, the control-apparatus-side section of the forward conductor can be at least as long as the load-side section of the forward conductor. The residual current sensor can therefore be spaced apart at a greater distance from the control apparatus than from the electrical load. An embodiment of this kind offers the advantage that a residual current can also be determined in the case of current feedback via a grounded vehicle structure in a manner that is reliable and close to the load.

In particular, the control apparatus can have at least one output connection for connection to the control-apparatus-side section of the forward conductor and an input connection for connection to a further structure-side section of the reverse conductor. In this case, it is possible that the further structure-side section and the structure-side section of the reverse conductor can be or are electrically conductively connected to one another by means of a structure element of the vehicle. In this case, the structure element can be grounded and formed from any electrical material. The control apparatus can also have further connections for connection to an electrical voltage source or current source. An embodiment of this kind offers the advantage that a space-saving and weight-saving realization of the residual current protective device and of the interconnection or wiring of the same and of the electrical load can be made possible.

In addition, the control apparatus can have an electrical evaluation circuit for evaluating the residual current signaled by the residual current sensor. In this case, the evaluation circuit can be configured to evaluate the residual current signaled by the residual current sensor by current amplitude modulation or modulation of a high-frequency data signal. An embodiment of this kind offers the advantage that it is possible to react suitably to an identified and signaled residual current in a reliable and quick manner.

A method for determining a residual current of an electrical load for a vehicle is furthermore presented, wherein the method has the following steps:

measuring a differential current between a first electric current in an electrical forward conductor, which forward-conducts from a control apparatus for controlling the electrical load to the electrical load, and a second electric current in an electrical reverse conductor, which conducts away from the electrical load; and signaling a residual current to the control apparatus via the forward conductor depending on a comparison of the measured differential current with a threshold value.

The method can advantageously be embodied in connection with or using an embodiment of the aforementioned residual current sensor or else the aforementioned residual current protective device.

An apparatus configured to carry out, trigger or implement the steps of a variant of a method presented here in corresponding devices is furthermore presented. The object on which the invention is based can also be achieved quickly and efficiently by this embodiment variant of the invention in the form of an apparatus.

The apparatus can be configured to read in input signals and to determine and supply output signals using the input signals. An input signal can constitute, for example, a sensor signal that can be read in by means of an input interface of the apparatus. An output signal can constitute a control signal or a data signal, which can be supplied at an output interface of the apparatus. The apparatus can be configured to determine the output signals using a processing rule implemented in hardware or software. For this purpose, the apparatus can comprise, for example, a logic circuit, an integrated circuit or a software module and can be realized, for example, as a discrete component or be comprised by a discrete component.

Also advantageous is a computer program product or computer program having program code that may be stored on a machine-readable carrier or storage medium such as a semiconductor memory, a hard disk memory or an optical storage unit. If the program product or program is executed on a computer or an apparatus, the program product or program can be used to carry out, implement and/or trigger the steps of the method in accordance with one of the embodiments described above.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
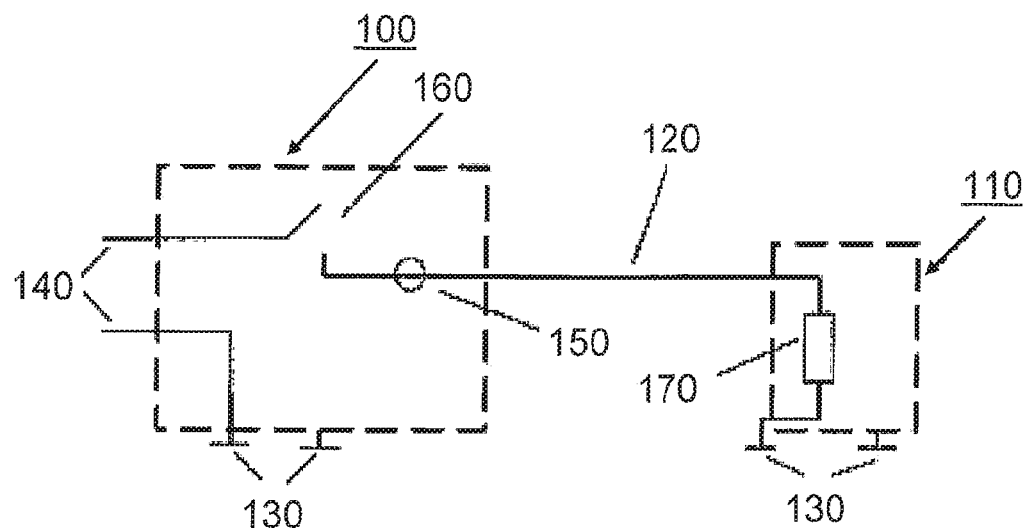
FIG. 1 shows a schematic illustration of a heater control apparatus and a heated component.

In the following description of advantageous exemplary embodiments of the present invention, identical or similar reference numerals are used for the similarly functioning elements illustrated in the various figures, wherein these elements will not be described again.

FIG. 1 shows a schematic illustration of a heater control apparatus 100 or a heater controller 100 and a heated component 110. Heater controllers 100 are used, for example, in airplanes for monitoring and driving heated components 110 in terms of power, such as floor panels and water pipes. In airplanes, an electrical connection between the heater controller 100 and the heated component 110 is usually effected in a single-pole manner by means of a forward conductor 120. The electric current is fed back from the heated component 110 to the heater controller 100 through a structure connection 130 or connection by means of a structure. Alternatively, it can also be fed back by means of busbars.

Here, both the heater controller 100 and the heated component 110 have at least one structure connection 130. In the illustration from FIG. 1, both the heater controller 100 and the heated component 110 each have two structure connections 130. The heater controller 100 furthermore has supply connections 140 for a supply voltage of the heater controller 100. In addition, the heater controller 100 has a current sensor 150 and an output switch 160. The heated component 110 has a heater 170, which represents an electrical load.

Figure 2:
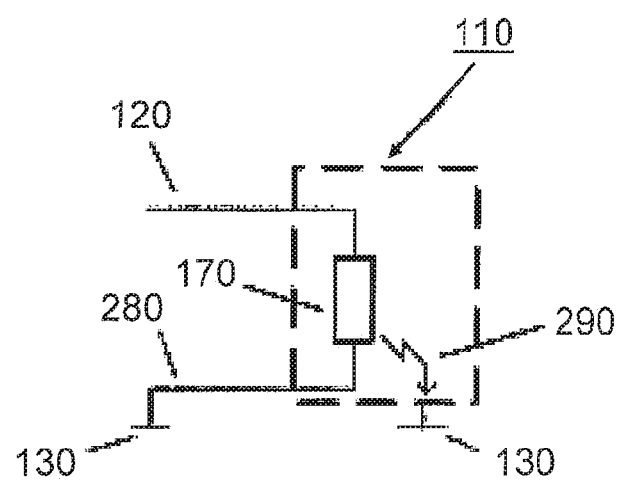
FIG. 2 shows a schematic illustration of the heated component from FIG. 1.

FIG. 2 shows a schematic illustration of the heated component 110 from FIG. 1. Shown here in FIG. 2 are the forward conductor 120 and, from the heated component 110, the structure connections 130, the heater 170, as well as a reverse conductor 280 and, symbolically, a residual current 290. The reverse conductor 280 extends here from the heater 170 to one of the structure connections 130.

In heated components 110, such as a heated floor panel, mechanical damage and/or ingress of liquids can lead to an insulation resistance decreasing and a residual current 290 arising between voltage-guiding parts of the heater part and a structure connected to the structure connections 130. Said residual current 290 leads to a current difference in the currents of the forward conductor 120 and the reverse conductor 280. Said generally low residual current 290 can possibly not be readily detected on account of the single-pole connection between the heater controller and the heated component 110 in the heater controller and can also possibly remain unidentified by an output current measurement using the current sensor in the heater controller.

Figure 3:
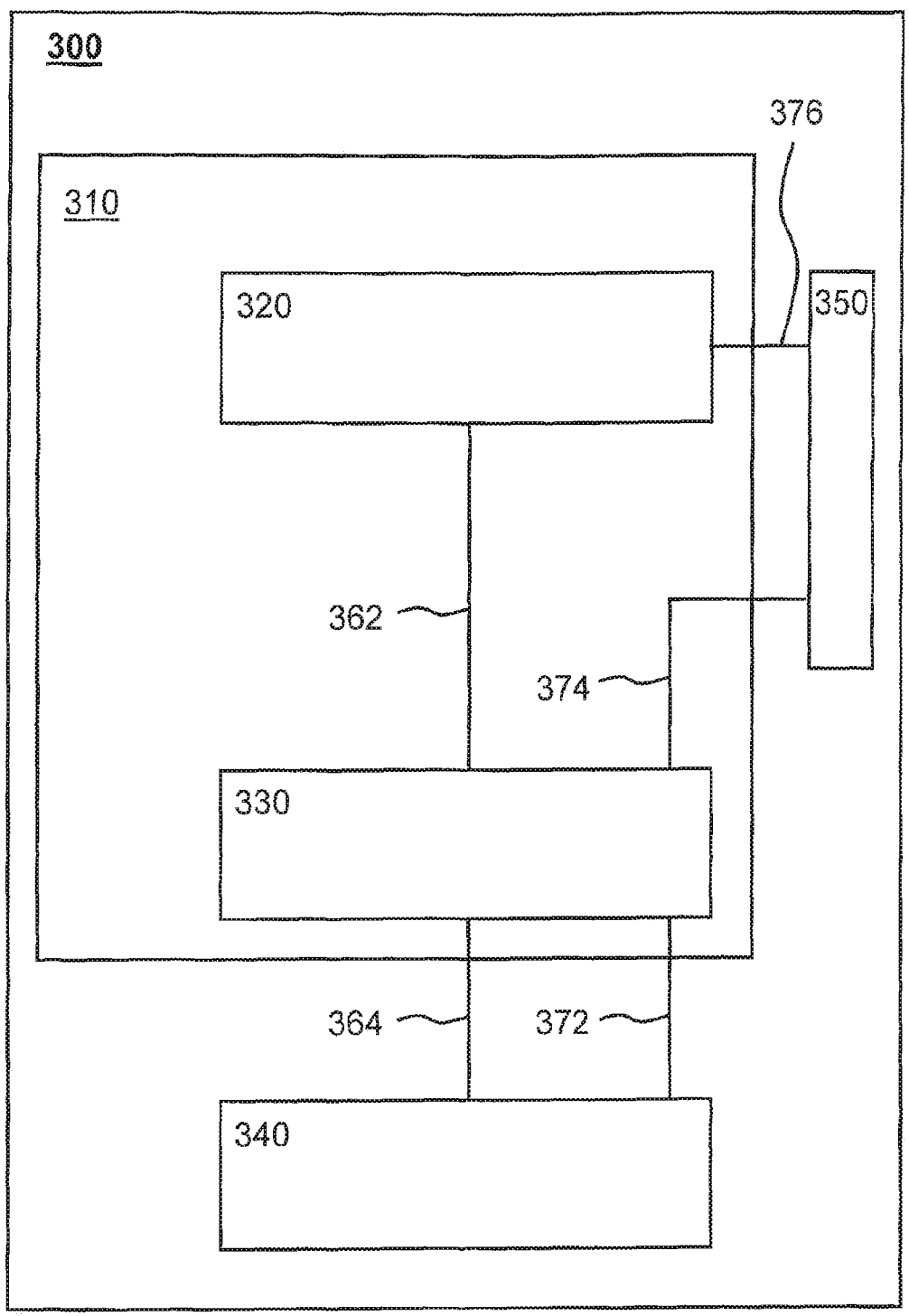
FIG. 3 shows a schematic illustration of a vehicle having a residual current protective device in accordance with an exemplary embodiment of the present invention.

FIG. 3 shows a schematic illustration of a vehicle 300 having a residual current protective device 310 in accordance with an exemplary embodiment of the present invention. The residual current protective device 310 is configured to monitor an electrical load of the vehicle 300 for a residual current.

The residual current protective device 310 has a control apparatus 320 and a residual current sensor 330 for this purpose. The vehicle 300 has the residual current protective device 310, an electrical load 340 and a grounded, electrically conductive structure 350 or a grounded, electrically conductive structure element 350 of the vehicle 300. The control apparatus 320 of the residual current protective device 310 is configured to control the electrical load 340. The residual current sensor 330 is electrically connected between the control apparatus 320 and the electrical load 340.

In accordance with the exemplary embodiment of the present invention illustrated in FIG. 3, the control apparatus 320, the residual current sensor 330 and the electrical load 340 are electrically conductively connected to one another by means of an electrical forward conductor and an electrical reverse conductor. In this case, the electrical forward conductor has a control-apparatus-side section 362 between the control apparatus 320 and the residual current sensor 330 and a load-side section 364 between the residual current sensor 330 and the electrical load 340. The electrical reverse conductor has a load-side section 372 between the electrical load 340 and the residual current sensor 330, a structure-side section 374 between the residual current sensor 330 and the vehicle structure 350 and a further structure-side section 376 between the vehicle structure 350 and the control apparatus 320.

In accordance with the exemplary embodiment of the present invention described and shown in FIG. 3, electric current is therefore forward-conducted from the control apparatus 320 via the control-apparatus-side section 362 of the forward conductor, the residual current sensor 330 and the load-side section 364 of the forward conductor to the electrical load 340. The electric current is fed back here from the electrical load 340 via the load-side section 372 of the reverse conductor, the residual current sensor 330, the structure-side section 374 of the reverse conductor, the vehicle structure 350 and the further structure-side section 376 of the reverse conductor to the control apparatus 320. The vehicle structure 350 can be considered functionally as part of the electrical reverse conductor. Even though it is not explicitly illustrated in FIG. 3, at least the forward conductor can be embodied as a consistent electrical conductor.

Figure 4:
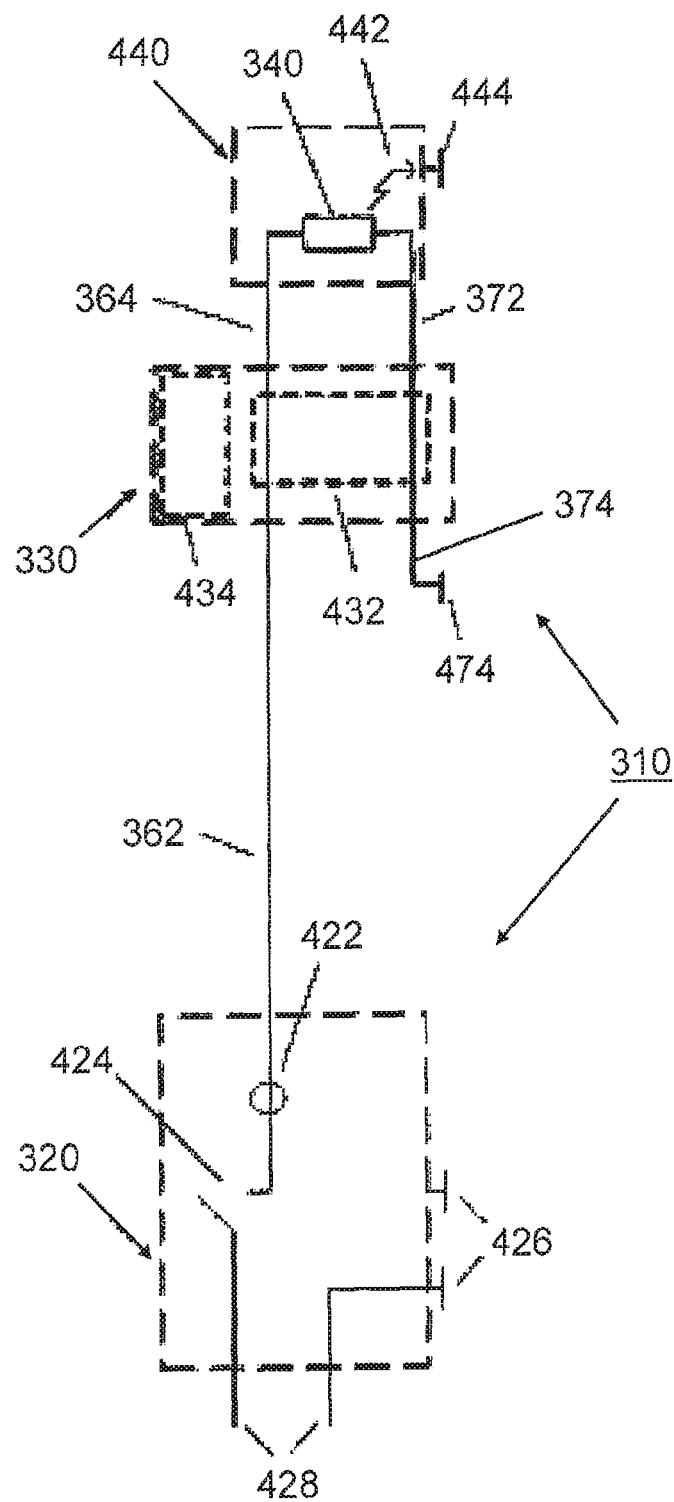
FIG. 4 shows a schematic illustration of a residual current protective device in accordance with an exemplary embodiment of the present invention and of an electrical load for a vehicle.

FIG. 4 shows a schematic illustration of a residual current protective device 310 in accordance with an exemplary embodiment of the present invention and of an electrical load 340 for a vehicle. The residual current protective device 310 is the residual current protective device from FIG. 3 or a similar residual current protective device. The residual current protective device 310 is therefore configured to monitor the electrical load 340. The residual current protective device 310 can be used in the vehicle from FIG. 3 or a similar vehicle. For example, the residual current protective device 310 is arranged in the vehicle from FIG. 3.

The illustration of the residual current protective device 310 in FIG. 4 corresponds in principle to the illustration of the residual current protective device from FIG. 3 with the exception of the fact that a current sensor 422, an output switch 424, structure connections 426 and supply connections 428 of the control apparatus 320 are further shown, that a measuring apparatus 432 and an electrical circuit 434 of the residual current sensor 330 are shown, that the electrical load 340 is embodied as a heater or heating element for a heated component 440, that a symbolically illustrated residual current 442 to a component structure connection 444 of the heated component 440 is shown and that a reverse conductor structure connection 474 is shown.

In accordance with the exemplary embodiment of the present invention illustrated in FIG. 4, the residual current sensor 330 has the measuring apparatus 432, the electrical circuit 434 or electronics 434 and a signaling apparatus. The measuring apparatus 432 is configured to measure a differential current between a first electric current in the electrical forward conductor, which forward-conducts from the control apparatus 320 for controlling the electrical load 340 to the electrical load 340, and a second electric current in the electrical reverse conductor, which conducts away from the electrical load 340. The electrical circuit 434 is configured to carry out a comparison of the measured differential current with a threshold value. The signaling apparatus of the residual current sensor 330 is configured to signal the residual current 442 to the control apparatus 320 via the forward conductor depending on the comparison of the measured differential current with the threshold value. The signaling apparatus, which is omitted in FIG. 4 purely for reasons of space in the drawing, will be dealt with in more detail below and in particular with reference to FIG. 5A, FIG. 5B and FIG. 6.

In accordance with one exemplary embodiment, the signaling apparatus is configured to signal the residual current 442 to the control apparatus 320 by using current amplitude modulation on the forward conductor, in particular on the control-apparatus-side section 362 of the forward conductor. In accordance with another exemplary embodiment, the signaling apparatus is configured to signal the residual current 442 to the control apparatus 320 by modulation of a high-frequency data signal on the forward conductor, in particular on the control-apparatus-side section 362 of the forward conductor.

In accordance with the exemplary embodiment of the present invention illustrated in FIG. 4, the control apparatus 320, which can also be referred to as a heater controller, has the current sensor 422, the output switch 424, the structure connections 426 and the supply connections 428. In this case, the current sensor 422 and the output switch 424 are connected to the control-apparatus-side section 362 of the forward conductor, which can also be referred to as a single-pole electrical connection. The current sensor 422 is configured to detect an electric current in the forward conductor. The output switch 424 is configured to interrupt a flow of electric current in the forward conductor. The control apparatus 320 also has an output connection for connection to the control-apparatus-side section 362 of the forward conductor. In this case, the current sensor 422 is electrically connected between the output switch 424 and the output connection. The control apparatus 320 can be connected to the structure-side section of the reverse conductor or directly to the structure element by means of the structure connections 426. At least one of the structure connections 426 here represents an input connection for connection to the further structure-side section of the reverse conductor or directly to the structure element. A voltage can be applied to the forward conductor and the reverse conductor by means of the supply connections 428. In other words, a system comprising the residual current protective device 310 and the heated component 440 having the electrical load 340 can be supplied with electrical power or can be connected to an electrical power source by means of the supply connections 428. In accordance with the exemplary embodiment of the present invention illustrated in FIG. 4, even though it is not explicitly illustrated in FIG. 4, the control apparatus 320 has an electrical evaluation circuit for evaluating the residual current 442 signaled by the residual current sensor 330. In addition or alternatively, the control apparatus 320 has a reception circuit for receiving the residual current 442 signaled by the residual current sensor 330.

The heated component 440 has the electrical load 340 or heater 340 and the component structure connection 444. The component structure connection 444 serves for grounding the heated component 440, for example. The heated component 440 can be connected to a vehicle structure or the structure element of the vehicle by means of the component structure connection 444.

The structure-side section 374 of the reverse conductor can be connected to the structure element of the vehicle by means of the reverse conductor structure connection 474. In this case, the reverse conductor structure connection 474 can optionally also be part of the residual current sensor 330. In this case, the structure-side section 374 of the reverse conductor and at least one of the structure connections 426 of the control apparatus 320 can be or are electrically conductively connected to one another by means of the structure element of the vehicle.

In accordance with the exemplary embodiment of the present invention illustrated here, the control apparatus 320 and the residual current sensor 330 are housed separately from one another, even though this is not explicitly illustrated in FIG. 4. In other words, the control apparatus 320 has a first housing and the residual current sensor 330 has a separate second housing, which housings are arranged at a distance or separated from one another. In accordance with the exemplary embodiment of the present invention illustrated in FIG. 4, the control-apparatus-side section 362 of the forward conductor is also at least as long as the load-side section 364 of the forward conductor. In this case, a length of the control-apparatus-side section 362 of the forward conductor can be merely approximately 1 meter, for example.

In other words, by using the residual current protective device 310, the electrical load 340 and/or the heated component 440 can be monitored for the occurrence of a residual current 442 through the already present heater controller 320 in connection with a residual current sensor 330 belonging to the heater controller 320 but physically remote therefrom. The residual current sensor 330 is placed directly on the heated component 440 that is to be monitored, for example, and the forward conductor and the reverse conductor to the heated component 440 are guided through the residual current sensor 330. By comparing the outgoing and returning current in the forward and reverse conductors or component connections, a residual current can therefore be indirectly identified in the residual current sensor 330, said residual current can be evaluated in the electrical circuit 434 or electronics 434 and, from a specific residual current value, for example 30 milliamps or the like, a return signal can be emitted to the control apparatus 320 or the heater controller 320. In the form of the evaluation apparatus, the control apparatus 320 has a technical apparatus configured to evaluate such feedback and consequently to disconnect the heated component 440 by means of a mechanical or electronic output switch 424, for example permanently, in a single-pole manner. An energy supply of the residual current sensor 330 that is remote from the heater controller 320 is or can be diverted from a supply voltage of the heated component 440 that is to be monitored. The feedback from the residual current sensor 330 to the heater controller 320 is effected via the forward conductor or a supply voltage line for the heated component 440 such that, in particular, no additional electrical connections are required. For example, the residual current sensor 330 does not permanently disconnect the monitored heated component 440, with the result that also no feedback signals have to be sent from the heating controller 320 to the residual current sensor 330. The residual current sensor 330 signals an identified present residual current 442 to the heater controller 320 via the forward conductor or the supply line preferably by changing a current amplitude. Such a change or change in current can be detected by an output current sensor already arranged in the heater controller 320 and can be evaluated in order to disconnect the heated component 440.

Figure 5A:
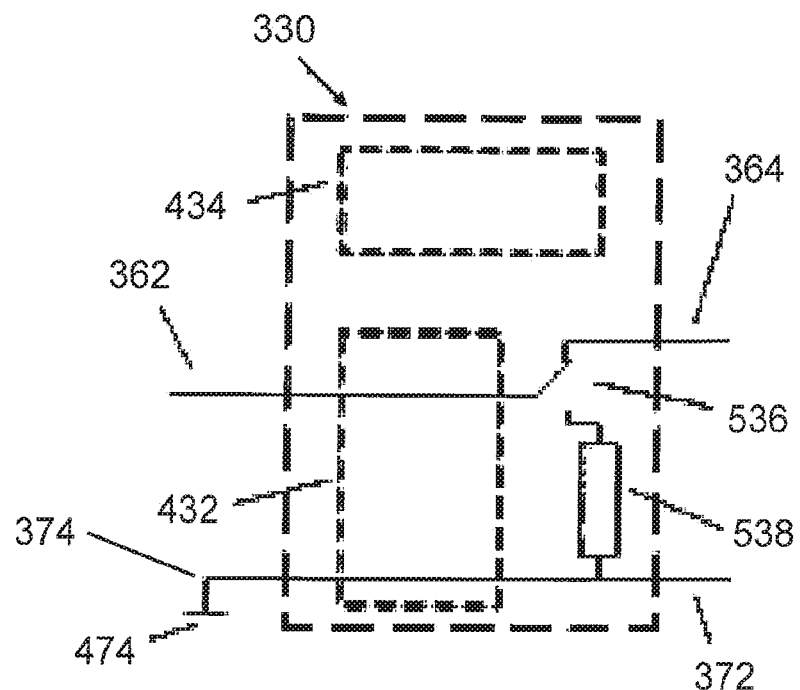
FIG. 5A shows a schematic illustration of a residual current sensor for a residual current protective device in accordance with an exemplary embodiment of the present invention.

FIG. 5A shows a schematic illustration of a residual current sensor 330 for a residual current protective device in accordance with an exemplary embodiment of the present invention. In this case, the residual current sensor 330 is the residual current sensor of the residual current protective device from FIG. 4 or a similar residual current sensor, wherein an embodiment variant of the signaling apparatus of the residual current sensor 330 is illustrated in more detail in FIG. 5A.

FIG. 5A illustrates the residual current sensor 330 having the measuring apparatus 432 and the electrical circuit 434, and the control-apparatus-side section 362 of the forward conductor, the load-side section 364 of the forward conductor, the load-side section 372 of the reverse conductor, the structure-side section 374 of the reverse conductor, and the reverse conductor structure connection 474 and further illustrates the signaling apparatus of the residual current sensor 330 having a load changeover switch 536 or current changeover switch 536 and a defined load 538.

The residual current sensor 330 therefore has the measuring apparatus 432, the electrical circuit 434 and the signaling apparatus, which has the load changeover switch 536 and the defined load 538. In other words, in accordance with the exemplary embodiment of the present invention illustrated in FIG. 5A, the signaling apparatus of the residual current sensor 330 has the load changeover switch 536 or switch 536 for the purpose of load changeover and the defined load 538. The defined load 538 is electrically connected to the reverse conductor or connected between a connection of the load changeover switch 536 and the reverse conductor. The load changeover switch 536 is configured, in an open switching position, to interrupt the forward conductor to the electrical load and to connect the forward conductor to the defined load 538.

In accordance with an exemplary embodiment, the residual current sensor 330 has a forward conductor input connection for connection to the control-apparatus-side section 362 of the forward conductor, a forward conductor output connection for connection to the load-side section 364 of the forward conductor, a reverse conductor input connection for connection to the load-side section 372 of the reverse conductor and a reverse conductor output connection for connection to the structure-side section 374 of the reverse conductor.

To signal a residual current, a change in current is generated, for example, by means of the load changeover switch 536, which can be embodied as a mechanical or electronic switch, in the residual current sensor 330 by virtue of the fact that the current to the heated component is disconnected and the defined load 538 arranged in the residual current sensor 330 is switched on. The current of the defined load 538 is below a range drawn by the heated component as supply current and can be interpreted as an occurrence of a residual current by a current measurement process in the heater controller. The current changeover to the defined load 538 leads, in particular, to a reliable identification of the fault type by the heater controller and can accordingly be evaluated as an identified residual current. The advantage of this is also that the current sensor for output current detection and the output switch are already implemented or arranged in the heater controller and, for example, just one additional current information evaluation has to be provided in the heater controller, if a fault is intended to be signaled as an identified residual current.

Figure 5B:
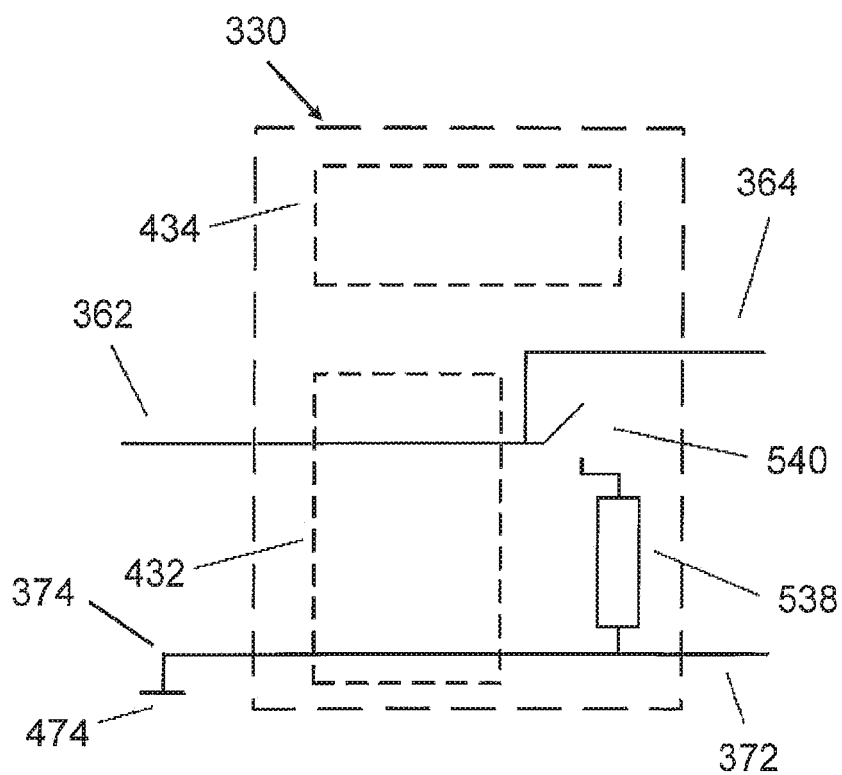
FIG. 5B shows a schematic illustration of a residual current sensor for a residual current protective device in accordance with an exemplary embodiment of the present invention.

FIG. 5B shows a schematic illustration of a residual current sensor 330 for a residual current protective device in accordance with an exemplary embodiment of the present invention. In this case, the residual current sensor 330 is the residual current sensor of the residual current protective device from FIG. 4 or a similar residual current sensor, wherein a further embodiment variant of the signaling apparatus of the residual current sensor 330 is illustrated in more detail in FIG. 5B. With the exception of the signaling apparatus, the residual current sensor 330 in FIG. 5B corresponds here to the residual current sensor from FIG. 5A. The signaling apparatus of the residual current sensor 330 has a load connection switch 540 switch 540 for load connection. The load connection switch 540 is configured, in a closed switching position, to connect the defined load 538 to the forward conductor 362, 364. In this variant, the load connection switch 540 does not disconnect the heated component.

Figure 6:
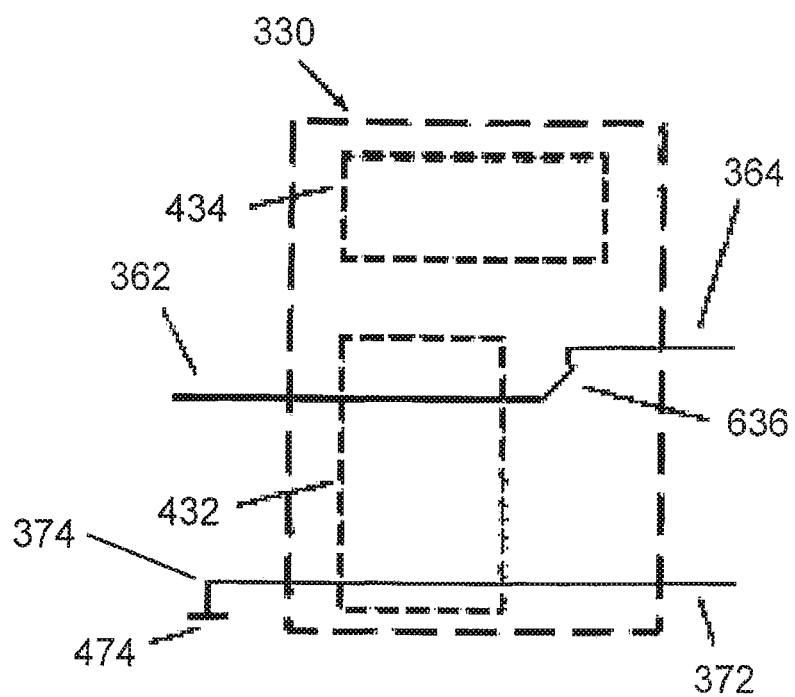
FIG. 6 shows a schematic illustration of a residual current sensor for a residual current protective device in accordance with an exemplary embodiment of the present invention.

FIG. 6 shows a schematic illustration of a residual current sensor 330 for a residual current protective device in accordance with an exemplary embodiment of the present invention. In this case, the residual current sensor 330 is the residual current sensor of the residual current protective device from FIG. 4 or a similar residual current sensor, wherein a further embodiment variant of the signaling apparatus of the residual current sensor 330 is illustrated in more detail in FIG. 6. With the exception of the signaling apparatus, the residual current sensor 330 in FIG. 6 corresponds furthermore to the residual current sensor from FIG. 5A and FIG. 5B.

In this case, the signaling apparatus of the residual current sensor 330 has a load disconnection switch 636 or current disconnection switch 636 or switch for load disconnection. The load disconnection switch 636 is configured, in an open switching position, to interrupt the forward conductor to the electrical load.

In this variant, the heated component is disconnected by the load disconnection switch 636, which is embodied, for example, as a mechanical or electronic switch, in the residual current sensor 330, which in turn leads to disconnection by the heater controller, since then a load current outside the defined range arises. The advantage of this is also that the current sensor for output current detection and the output switch are already implemented or arranged in the heater controller and, for example, just one additional current information evaluation has to be provided in the heater controller, if a fault is intended to be signaled as an identified residual current.

Figure 7:
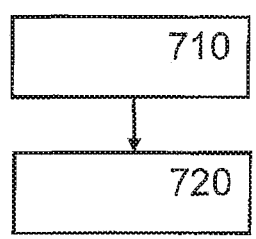
FIG. 7 shows a flow chart of a method in accordance with an exemplary embodiment of the present invention.

FIG. 7 shows a flow chart of a determination method 700 in accordance with an exemplary embodiment of the present invention. The method 700 can be executed to determine a residual current of an electrical load for a vehicle. In this case, the determination method 700 can be executed in connection with or using the residual current sensor from one of FIGS. 3 to 6 or a similar residual current sensor or in connection with or using a residual current protective device from one of FIGS. 3 to 4 or a similar residual current protective device.

In accordance with the exemplary embodiment of the present invention illustrated in FIG. 7, the determination method 700 has a measuring step 710 and a signaling step 720. In this case, in the measuring step 710, a differential current between a first electric current in an electrical forward conductor, which forward-conducts from a control apparatus for controlling the electrical load to the electrical load, and a second electric current in an electrical reverse conductor, which conducts away from the electrical load, is measured. In the signaling step 720, a residual current is signaled to the control apparatus via the forward conductor depending on a comparison of the measured differential current with a threshold value.

In accordance with one exemplary embodiment, a method 700, between the measuring step 710 and the signaling step 720, a step of comparing the measured differential current with a threshold value can also be carried out in order to identify or determine the presence of a residual current.

The exemplary embodiments described and shown in the figures are selected purely by way of example. Different exemplary embodiments may be combined with one another in full or in relation to individual features. It is also possible to supplement an exemplary embodiment with features of a further exemplary embodiment. Furthermore, it is possible for method steps according to the invention to be repeated and to be carried out in a different sequence to that described.

If one exemplary embodiment comprises an "and/or" conjunction between a first feature and a second feature, this should be read as meaning that the exemplary embodiment, in accordance with one embodiment, has both the first feature and the second feature and, in accordance with a further embodiment, has either only the first feature or only the second feature.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A residual current sensor for a residual current protective device for monitoring an electrical load for a vehicle, the residual current sensor comprising:
 a measuring apparatus for measuring a differential current between a first electric current in an electrical forward conductor that forward-conducts from a control apparatus for controlling the first electric current to the electrical load and a second electric current in an electrical reverse conductor that conducts away from the electrical load to a grounded element of the vehicle; and a signaling apparatus for signaling, via the forward conductor, a detection of a residual current back to the control apparatus, the residual current sensor detecting the residual current based on a comparison of the measured differential current with a threshold value, wherein the first electric current is conducted via the residual current sensor and the second electric current is conducted via the residual current sensor.

2. The residual current sensor according to claim 1, in which the signaling apparatus is configured to signal the detection of the residual current to the control apparatus using current amplitude modulation on the forward conductor.

3. The residual current sensor according to claim 1, in which the signaling apparatus has a switch for connecting a defined load, wherein the defined load is electrically conductively connected to the reverse conductor, wherein the switch is configured, in a closed switching position, to connect the defined load to the forward conductor.

4. The residual current sensor according to claim 1, in which the signaling apparatus has a switch for load disconnection, wherein the switch is configured, in an open switching position, to interrupt the forward conductor.

5. The residual current sensor according to claim 1, in which the signaling apparatus is configured to signal the detection of the residual current to the control apparatus by modulation of a high-frequency data signal on the forward conductor.

6. The residual current sensor according to claim 1, which has an electrical circuit for carrying out the comparison of the measured differential current with the threshold value.

7. A residual current protective device for monitoring an electrical load for a vehicle, wherein the residual current protective device has the following features:

a residual current sensor as claimed in claim 1; and
the control apparatus for controlling the electrical load, wherein the control apparatus and the residual current sensor can be or are electrically conductively connected to one another at least by means of the forward conductor.

8. The residual current protective device according to claim 7, in which the control apparatus and the residual current sensor are housed separately from one another.

9. The residual current protective device according to claim 7, wherein the residual current sensor has a forward conductor input connection for connection to a control-apparatus-side section of the forward conductor, a forward conductor output connection for connection to a load-side section of the forward conductor, a reverse conductor input connection for connection to a load-side section of the reverse conductor and a reverse conductor output connection for connection to a structure-side section of the reverse conductor.

10. The residual current protective device according to claim 9, wherein the control-apparatus-side section of the forward conductor is at least as long as the load-side section of the forward conductor.

11. The residual current protective device according to claim 9, in which the control apparatus has at least one output connection for connection to the control-apparatus-side section of the forward conductor and an input connection for connection to a further structure-side section of the reverse conductor, wherein the further structure-side section and the structure-side section of the reverse conductor can be or are electrically conductively connected to one another by means of a grounded structure element of the vehicle.

12. The residual current protective device according to claim 7, in which the control apparatus has an electrical evaluation circuit for evaluating the detection of the residual current signaled by the residual current sensor.

13. The residual current sensor according to claim 1, in which the forward conductor is at least one single-pole conductor line connecting the control apparatus and the electrical load, the residual current sensor disposed between the control apparatus and the electrical load.

14. The residual current sensor according to claim 1, in which a return signal of the signaling apparatus transmits the detection of the residual current back to the control apparatus along the forward conductor, the return signal being a current modulation.

15. The residual current sensor according to claim 1, in which the reverse conductor for the measuring apparatus is connected to a grounded element of the vehicle.

16. A method for determining a residual current of an electrical load for a vehicle, the method comprising:

measuring a differential current between a first electric current in an electrical forward conductor that forward-conducts from a control apparatus for controlling the first electrical current to the electrical load and a second electric current in an electrical reverse conductor that conducts away from the electrical load to a grounded element of the vehicle; and signaling a detection of a residual current back to the control apparatus via the forward conductor based on a comparison of the measured differential current with a threshold value, wherein the first electric current is conducted via the residual current sensor and the second electric current is conducted via the residual current sensor.

17. A computer program product stored on a machine-readable storage medium having program code for performing the method according to claim 16, when the program product is executed on an apparatus.

* * * * *